United States Patent [19]
Kojima et al.

[11] Patent Number: 4,888,783
[45] Date of Patent: Dec. 19, 1989

[54] SEMICONDUCTOR LASER DEVICE

[75] Inventors: Keisuke Kojima; Kazuo Kyuma; Susumu Noda; Masaaki Kameya; Jun Ohta; Koichi Hammanaka, all of Amagasaki, Japan

[73] Assignee: Mitsubishi Denki Kabushiki Kaisha, Japan

[21] Appl. No.: 169,472

[22] Filed: Mar. 17, 1988

[30] Foreign Application Priority Data

Mar. 20, 1987 [JP] Japan .................................. 62-66249
May 12, 1987 [JP] Japan ................................ 62-115282
Aug. 27, 1987 [JP] Japan ................................ 62-213959

[51] Int. Cl.$^4$ .............................................. H01S 3/19
[52] U.S. Cl. ........................................ 372/44; 372/45; 372/50; 372/96; 372/26
[58] Field of Search ...................... 372/46, 45, 96, 50, 372/26, 8, 44, 102; 357/19, 30

[56] References Cited

U.S. PATENT DOCUMENTS

| | | | |
|---|---|---|---|
| 4,658,402 | 4/1987 | Kobayashi | 372/8 |
| 4,674,100 | 6/1987 | Kobayashi | 372/8 |
| 4,720,835 | 1/1988 | Akiba et al. | 372/26 |
| 4,755,015 | 7/1988 | Uno et al. | 372/45 |

OTHER PUBLICATIONS

Uematsu et al., "Grating-Coupled GaAs—CaAlAs Lasers with Distributed Bragg Reflectors," Electronica Letters, Dec. 8, 1977, vol. 13, No. 25, pp. 759–760.
Shames et al., "Monolithic Integration of GaAs-(GaAl)As Light Modulators and Distributed-Bragg-Reflector Lasers," Appl. Phys. Lett., 32(5), Mar. 1, 1978, pp. 314–316.
Appl. Phys. Lett., 49(10), Tarucha et al., "Voltage-Controlled Optical Bistability Associated with Two-Dimensional Exciton in GaAs-AlGaAs Multiple Quantum Well Lasers", Sep. 1986, pp. 543–545.
IEEE Journal of Quantum Electronics, Bol. QE-22, No. 9, Sep. 1986, "Temperature Dependence of Bistable InGaAsP/InP Lasers", Liu et al., pp. 1579–1586.

Primary Examiner—John D. Lee
Assistant Examiner—Georgia Y. Epps
Attorney, Agent, or Firm—Leydig, Voit & Mayer

[57] ABSTRACT

In a light-responsive semiconductor device in which the laser oscillation state is controlled by incident light, a layer of material having a conductivity modulatable by light is integrated in a semiconductor laser structure and is responsive to the incident light for the control of the laser oscillation state of the device. In one embodiment constituting a light logic element, a plurality of semiconductor lasers are integrated on a substrate with each respective semiconductor laser having a grating along the entirety or a portion thereof and provided with a light waveguide connecting with a waveguide of an adjacent semiconductor laser. In a bistable semiconductor laser there are provided two different conductivity type light confinement layers, an active layer comprising a multiple quantum well structure which is between the two light confinement layers, a grating provided close to the quantum well active layer. The oscillation wavelength established by the grating is shorter than the peak gain wavelength produced by the quantum well active layer.

19 Claims, 12 Drawing Sheets

SEMICONDUCTOR LASER DEVICE

FIELD OF THE INVENTION

The present invention relates to a light-responsive semiconductor device and, more particularly, to a device in which the oscillation state of a semiconductor laser can be controlled by externally incident light that is capable of parallel, high speed signal processing and in which a bistable semiconductor laser is used in light information processing or light interchanging.

BACKGROUND OF THE INVENTION

FIG. 4 shows a prior art light semiconductor device described in Applied Physics Letters Vol. 44, pp. 941.

In FIG. 4, reference numeral 1 designates an n-type substrate. Reference numerals 3, 4, and 5 respectively designate an n-type cladding layer, an active layer, and a p-type cladding layer successively disposed on the n-type substrate 1 with an intervening n+-type buffer layer 11. Reference numeral 6 designates embedding layers disposed on the substrate 1 at both sides of the layers 3, 4, and 5. The Reference numeral 7 designates a p-type cap layer. Reference numeral 12 designates an anode electrode. Reference numerals 13, 14, and 15 respectively designate a drain, a gate, and source electrodes of a field effect transistor. Reference numeral 16 designates a photodiode.

In this prior art light-responsive semiconductor device, the light Pin incident from the outside is converted into an electric signal by photodiode 16, and is amplified by the field effect transistor comprising the source 15, the drain 13, and the gate 14. This amplified signal is transmitted to the semiconductor laser comprising the n-type cladding layer 3, the active layer 4, the p-type cladding layer 5, the embedding layers 6, the p-type cap layer 7, and the anode electrode 12. When the semiconductor laser is previously biased by an appropriate current value, a light output Pout, modulated according to the variation of the incident light Pin, is obtained.

However, in this arrangement, different components of the device, such as the semiconductor laser, the photodiode, or the field effect transistor are produced through different production processes and integrated on the same substrate. Therefore, the production is often difficult and yields are poor. Furthermore, it is often difficult to increase the area of the photodiode for receiving the incident light, thereby making it unsuitable in light information processing applications such as the processing of input information in the form of video images.

FIG. 11 shows a prior art light logic element shown in IEEE Journal of Quantum Electronics vol. QE-18, No. 9, p. 1341 to 1361, (1982) by Christoph Harder, Kam Y. Lau, and Amnon Yariv. In FIG. 11, reference numeral 16 designates an n-type GaAs substrate. Reference numeral 15 designates an n-type AlGaAs cladding layer, reference numeral 14 designates an AlGaAS active layer, and reference numeral 13 designates a p-type AlGaAs cladding layer. Reference numeral 19 designates a p-type AlGaAs current blocking layer, and reference numeral 18 designates an n-type AlGaAs current blocking layer, both provided at the sides of the active layer 14 and the cladding layers 13 and 15. Reference numeral 12 designates a Zn-diffused layer for reducing the contact resistance of the p-type electrode. Reference numeral 11 designates a SiO$_2$ insulating film. Reference numerals 10a and 10b both designate p-side electrodes, and reference numeral 17 designates an n-side electrode.

The device is operated as follows.

At first, a slight current is made to flow through the electrode 10a in the forward direction, or a reverse bias is applied to the electrode 10a. Then, the active layer therebelow functions as a saturable absorber. That is, as shown in FIG. 12, when the light power is low, it has large absorption, and as the light power increases, the light absorption decreases.

FIG. 13 shows the relationship between the current Ib which flows through the electrode 10b and the light output L. When the current Ib is increased, the absorption at the saturable absorber is reduced gradually by the increase in the natural emission light, and when the current Ib reaches Ib$_1$, the laser oscillation is started.

Once the laser oscillation is started, the absorption is quite small due to the strong laser light, and even when the current is reduced to some extent, the oscillation is not stopped. The oscillation only stops when the current Ib reaches Ib$_2$. That is, when the current Ib is biased at an intermediate value between Ib$_1$ and Ib$_2$, this element can be used as a memory element capable of being turned on (capable of also being turned off in a case of current) by a current pulse or an incident light. This laser comprises a resonator formed by cleavage planes at the front and rear surfaces.

In this prior art light logic element, however, it is impossible to connect a number of light logic elements serially because cleavage planes are required. Furthermore, a large number of lenses and precise positioning and focusing of the respective elements are required in order to combine light logic elements.

FIG. 18 shows another prior art bistable semiconductor laser disclosed in Liu and Kamiya, Technical digest of the 10th IEEE International Semiconductor Laser Conference, Paper J-3, Kanazawa, Japan, 1986. In FIG. 18, reference numeral 16 designates an n-type InP substrate, reference numeral 15 designates an InGaAsP active layer, reference numeral 14 designates a p-type InP light confinement layer, and reference numeral 13 designates a p-type InGaAsP contact layer. Reference numeral 18 designates a p-type InP blocking layer and reference numeral 19 designates an n-type InP blocking layer. Reference numerals 12a, 12b designate p-side electrodes, and reference numeral 17 designates an n-side electrode.

The device is operated as follows.

There are provided three electrodes 12, and differentiated currents flow through the electrodes 12a at the gain region 8 and through the electrode 12b at the absorption region 9. As shown in FIG. 20, the increase in the current is accompanied by an increase in the carrier concentration. In accordance therewith the absorption coefficient is lowered and gain is quickly obtained. When a slight constant current flows through the absorption region 9 (it may be 0) and the current flowing through the gain region 8 is increased, oscillation does not occur due to the absorption at the absorption region 9 until the current becomes I$_1$ as shown in FIG. 19. When the current exceeds I$_1$, oscillation occurs. When oscillation starts, the absorption region 9 absorbs the laser light, and carrier density increases and the absorption coefficient is reduced as shown in FIG. 20. Accordingly, when the current is decreased gradually in this state, the oscillation stops when the current has just reached I₂. In this prior art device, a bistable property is obtained.

Herein, the rise and decay times for rising up and falling down of such a laser is about 200 pico seconds at minimum. But this is not fast enough.

A quantum well structure is usually used for the active layer in order to enhance the operation speed in a semiconductor laser. In such a case, however, the absorption coefficient of the quantum well structure in the current non-injecting state is low at the wavelength at which the gain coefficient in the current injected state becomes the highest as shown in FIG. 2, and it is not large enough to exhibit bistable operation.

The prior art bistable semiconductor laser has drawbacks in that operation speed is limited and the oscillation wavelength is unstable.

SUMMARY OF THE INVENTION

An object of the present invention is to provide a light responsive semiconductor device capable of simplifying the production process and capable of forming the same into an array and also increasing the light receiving surface area.

Another object of the present invention is to provide a light-responsive semiconductor device constituting a light-responsive logic element capable of having all the logic elements on the same substrate, all without requiring lenses and positioning lenses, and furthermore capable of carrying out complicated operations.

Another object of the present invention is to provide a light-responsive device constituting a bistable semiconductor laser capable of high speed operation and a stable oscillation wavelength.

According to an aspect of the present invention, in a semiconductor laser where the laser oscillation state can be controlled by the incident light from the outside, a material layer having a light conductivity modulatable property is provided and integrated into the semiconductor laser structure. Thus, the device can be produced relatively easily and at a high yield, and the area of the light receiving surface may be increased.

According to another aspect of the present invention, a resonator of a semiconductor laser is constituted by a light waveguide provide with a grating and a plurality of semiconductor lasers are combined with each other by the light waveguides. Accordingly, a light logic element capable of complicated operation comprising a plurality of logic elements disposed on a same substrate is easily realized and a large number of lenses and precise positioning and focusing of the respective logic elements are not required.

According to another aspect of the present invention, the active layer is made of a quantum well structure which enables high operation speed. The oscillation wavelength is established at a wavelength shorter than the gain peak wavelength by a grating. Accordingly, the oscillation wavelength is stabilized as well as fixed by the grating at a wavelength at which the quantum well structure has a large absorption coefficient. Thus, an increase in operational speed and stabilization of the oscillation wavelength are realized.

DETAILED DESCRIPTION OF THE PREFERRED EMBODIMENTS

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

Figure 18:
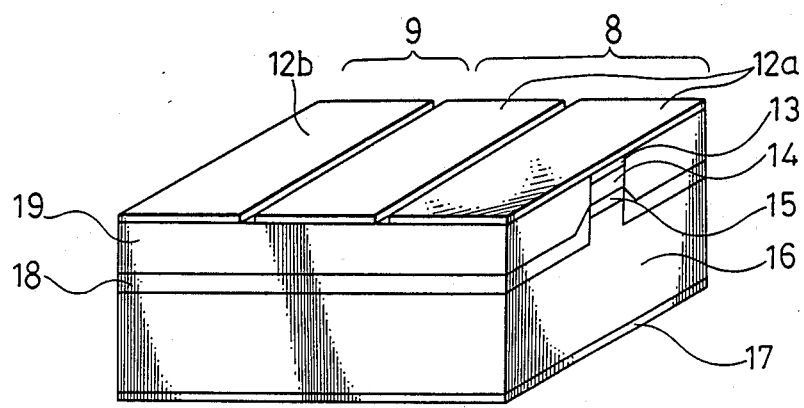
FIG. 18 shows a conventional bistable semiconductor laser.
Figure 19:
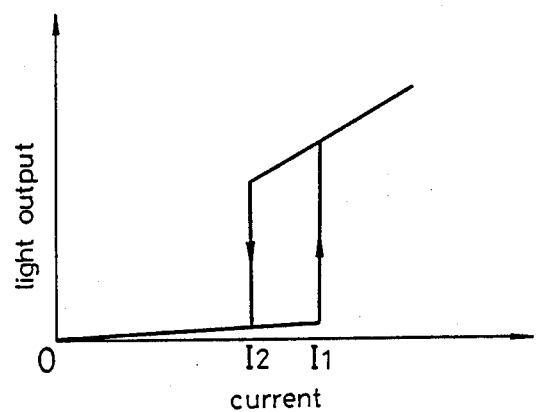
Figure 20:
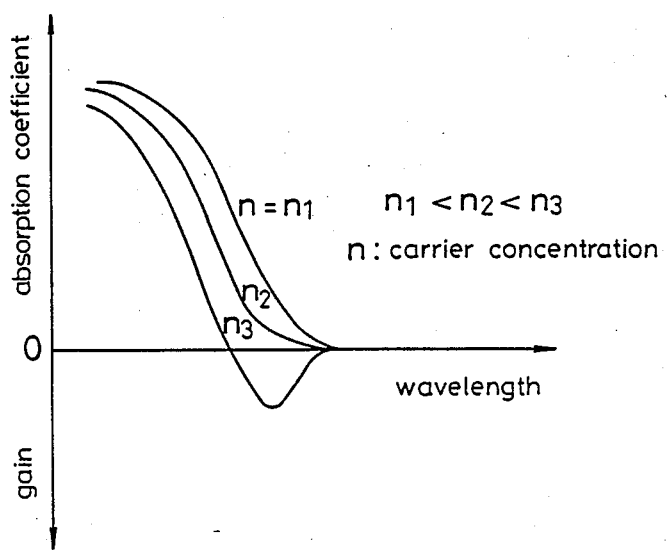

FIGS. 19 and 20 respectively illustrate the relationships between current and light output and between wavelength and the absorption coefficient produced by the device of FIG. 18.

Embodiments of the present invention will be described in detail with reference to the drawings.

Figure 1:
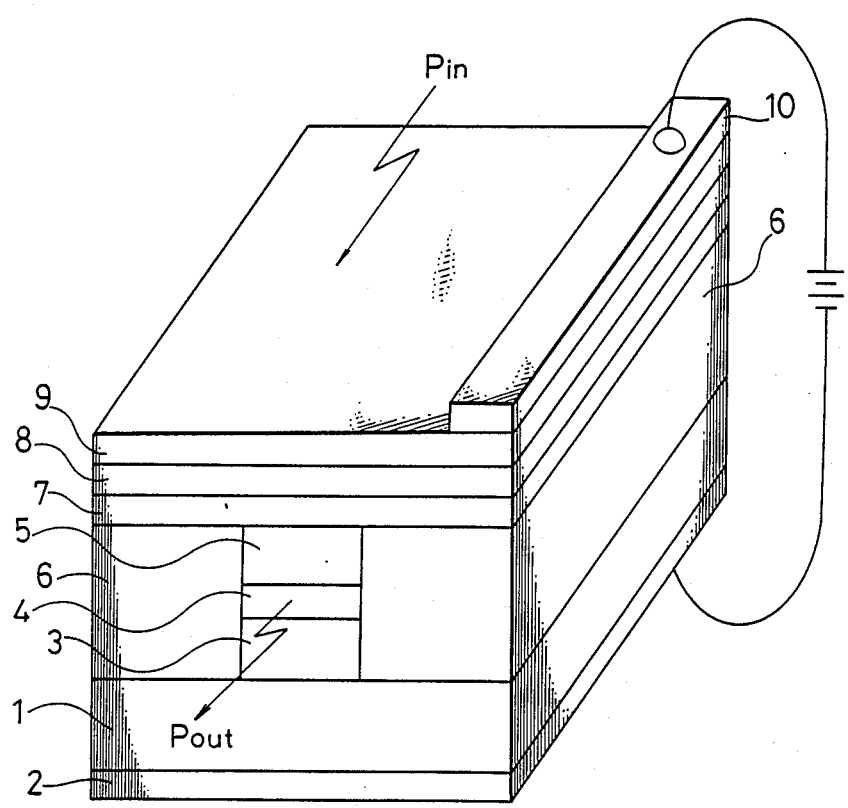
FIG. 1 is a perspective view of a semiconductor laser device in accordance with an embodiment of the present invention.
Figure 4:
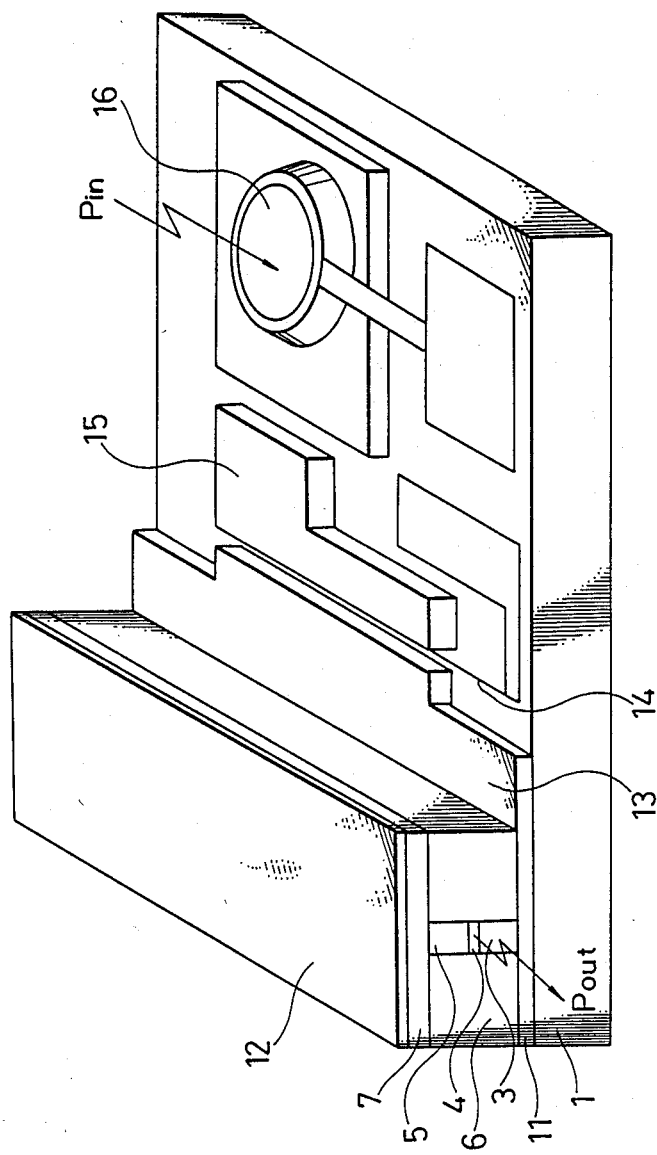
FIG. 4 is a perspective view of a conventional semiconductor laser.

FIG. 1 shows a perspective view of a semiconductor laser device according to a first embodiment of the present invention. In FIG. 1, the same reference numerals are those shown in FIG. 4 designate the same or corresponding elements.

In FIG. 1, reference numeral 1 designates an n-type substrate, and reference numeral 2 designates an n-side electrode. Reference numerals 3, 4, and 5 respectively designate an n-type cladding layer, an active layer, and a p-type cladding layer successively disposed on the n-type substrate 1. Reference numeral 6 designates embedding layers disposed on the n-type substrate 1 at both sides of the layers 3, 4, and 5. Reference numeral 7 designates a p-type cap layer. A semiconductor laser having the same construction as that in the prior art device is constituted by these layers. Furthermore, reference numeral 8 designates a layer of material having a conductivity modulatable with light, such as CdS, which is provided on the p-type cap layer 7. Reference numeral 9 designates a transparent electrode produced thereon, and reference numeral 10 designates an aluminium electrode.

In operation, an appropriate voltage is applied to the conductivity modulatable material layer 8 disposed on the p-type cap layer 7 through the aluminium electrode 10 on the transparent electrode 9. When there is no incident light from the outside, the resistivity of the conductivity modulatable material layer 8 is high and little of the voltage is applied to the semiconductor laser itself. Accordingly, there is no laser oscillation.

Figure 2:
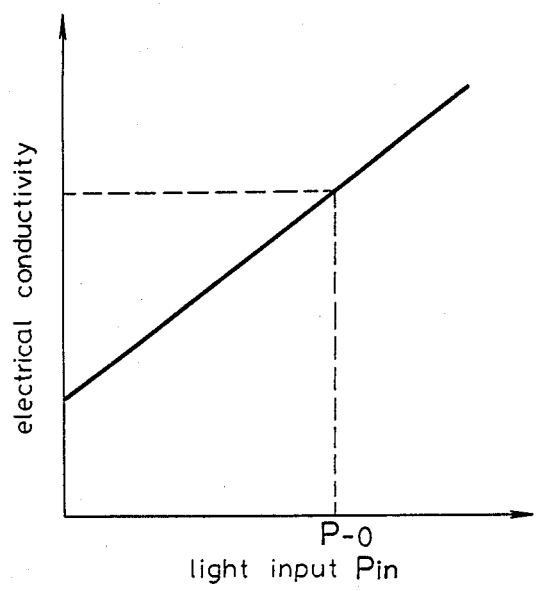
FIGS. 2 and 3 illustrate the relationship between light input, the electrical conductivity, and light output, respectively, of the semiconductor device of FIG. 1.
Figure 3:
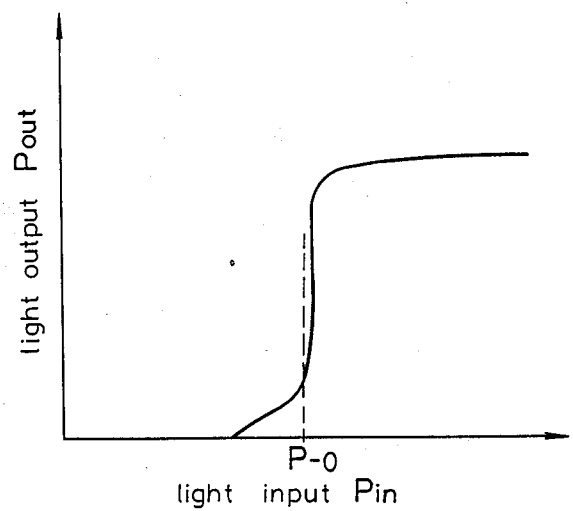

When light is incident from the outside, the electrical conductivity of the conductivity modulatable material layer 8 is increased and the voltage applied to the laser portion (between the p-type cap layer 7 and the n-type electrode 1) is increased due to the light input $P_{in}$ from the outside. When the voltage exceeds a predetermined input power $P_{-o}$, it is sufficient for the laser oscillation, thereby producing a laser oscillation as shown in FIGS. 2 and 3. When the input power is increased to a value higher than $P_{-o}$, only the voltage applied to the laser portion is increased, and the light output $P_{out}$ is not much changed (after the laser begins oscillating, the terminal voltage of the laser portion is almost constant). In this way, control of the laser oscillation by external incident light is achieved.

In this first embodiment of the present invention, in a light-responsive semiconductor device in which the laser oscillation state can be controlled by external incident light a layer having a conductivity modulatable by light is integrated in the semiconductor laser device structure and a control light is incident to the device through this material layer. Accordingly, it is possible to achieve laser oscillation control by incident light of a predetermined intensity in a structure including a prior-art semiconductor laser. Therefore, the novel device itself can be produced by a relatively simple production process with high precise and yield. Furthermore, the area of the light receiving surface for the incident light can be large, as is effective in the information processing.

In the above illustrated first embodiment, a so-called buried-type laser is adopted, but the present invention can be applied to any type of laser structure. Furthermore, it is possible to provide a plurality of structures of this embodiment in one-dimensioned or two-dimensional array. Furthermore, the laser may be made in a surface light emission type in which the control light is incident from the upper or lower side and the output light is taken out from the lower side or upper side.

Figure 5:
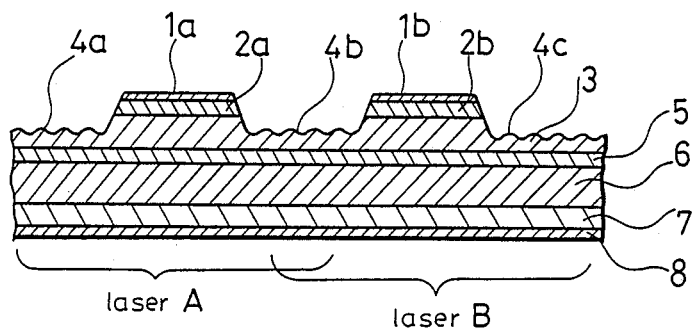
FIG. 5 is a sectional view of a light-responsive semiconductor device constituting a light logic element according to an embodiment of the present invention.

FIG. 5 shows a light-responsive semiconductor device comprising a light logic element as a second embodiment of the present invention. In FIG. 5, reference numerals 1a and 1b both designate p-side electrodes, and reference numerals 2a and 2b designate p-type GaAs contact layers. Reference numeral 3 designates a p-type AlGaAs cladding layer, and the reference numrals 4a, 4b, and 4c designate gratings produced on the surface of the p-type AlGaAs cladding layer 3. Reference numeral 5 designates an AlGaAs/GaAs quantum well active layer, reference numeral 6 designates an n-type AlGaAs cladding layer, reference numeral 7 designates an n-type GaAs substrate, and reference numeral 8 designates an n-type electrode. The laser A is controlled by a current flowing through the p-type electrode 1a, and has a resonator produced by the gratings 4a and 4b. Usually, this is called a distributed Bragg reflection type laser (DBR laser). The laser B is controlled by a current flowing through the p-type electrode 1b, and has a resonator produced by the gratings 4b and 4c. The lasers A and B are interconnected by a light waveguide comprising the p-type cladding layer 3 including the grating 4b, the active layer 5, and the n-type cladding layer 6.

The device is operated as follows.

Figure 6:
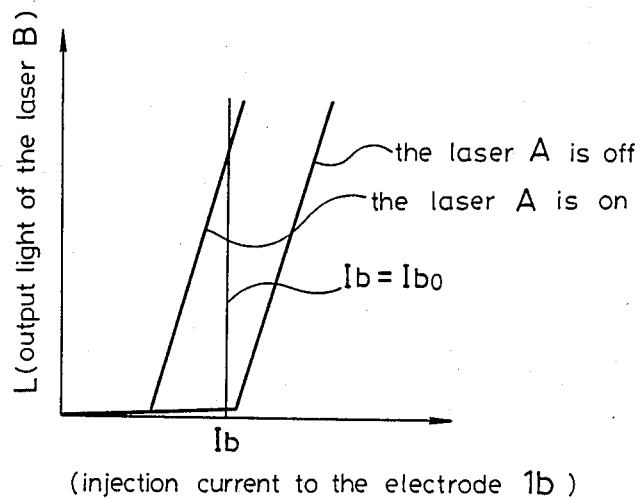
FIGS. 6-8 illustrate the relationship between the injection current to the electrode and the light output produced by the device of FIG. 5.

FIG. 6 shows the relationship between the light output L of the laser B (which is transmitted in the waveguide in the left and rightward directions in FIG. 5) and the current flowing through the electrode 1b of the embodiment of FIG. 5. When laser A is turned off, the device shows the current-light output characteristics shown in the right curve of FIG. 6. When the laser A is turned on, the light is injected into the laser B by the light waveguide including the grating 4b, and the laser oscillation current threshold is reduced. Accordingly, the device shows the characteristic of the left curve of FIG. 6. That is, if the device is biased at a current $Ib = Ib_0$ ($Ib_0$ is a value intermediate the threshold currents of the laser B when the laser A is turned on and off, respectively), the light output L of the laser B is controlled by the on or off state of the laser A.

Figure 7:
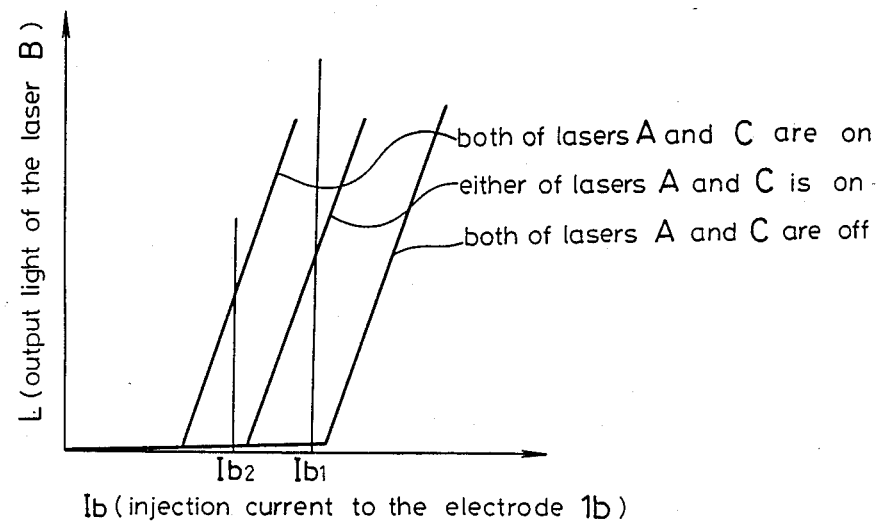

FIG. 7 shows the relationship between the light output L of the laser B and a current flowing through the electrode 1b in a structure in which laser B is put between two lasers A and C, an alternative of the embodiment of FIG. 5. As shown in FIG. 7, the current-light output characteristics of the laser B can be controlled by the two lasers A and C between which laser B is disposed. If the device is biased at $Ib = Ib_1$, the laser B is turned on when either of the lasers A and C is turned on, exhibiting the function of an OR gate or element. If the device is biased at $Ib = Ib_2$, the laser B is turned on only when both of the lasers A and C are turned on, exhibiting the function of an AND gate or element.

In the second embodiment of the present invention, a plurality of semiconductor lasers are integrated on the same substrate, and each semiconductor laser is combined interconnected by a light waveguide provided with a grating at the entirety or at a portion of each element. Accordingly, light is not emitted to the outside of the respective elements and thus, a large number of lenses and precise positioning and focusing of each element are not required, thereby enabling one to obtain a small-sized, low-cost, and stable light logic element.

Besides, if second-order gratings are used for the gratings 4a to 4c, it is possible to input and output light in the direction normal to the substrate. For example, by injecting light from the gratings 4b or 4c instead of turning on or off the laser A, it is possible to control the oscillation of the laser B.

Figure 8:
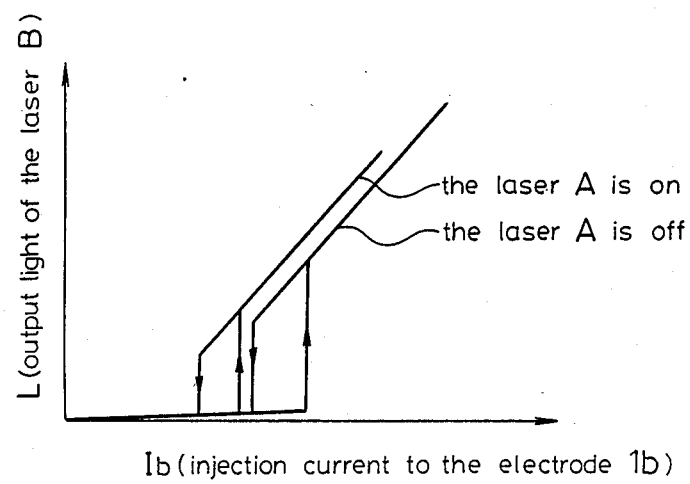

When the active layer 5 is a material having a strongly saturable absorption property in the current non-injecting state (such as where the active layer is GaAs), the respective lasers exhibit ,trong bistable properties as shown in FIG. 8, thereby enabling one to provide a data storage function.

Figure 9:
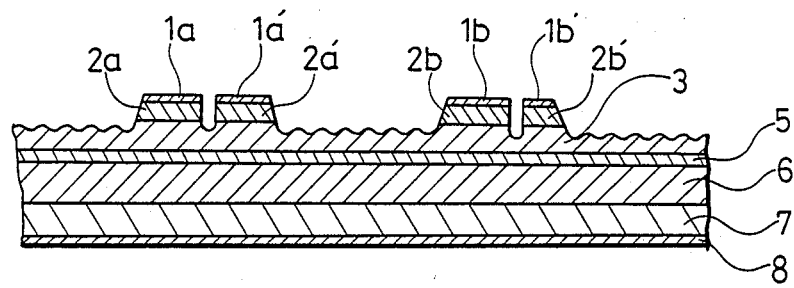
FIG. 9 shows a light-responsive semiconductor device similar to that of FIG. 5.

In FIG. 9, a structure like that of FIG. 8 is shown except that electrodes 1a annd 1b and the respective underlying contacting layers 2a and 2b are divided transversely into contacts 1a, 1a' and 1b, 1b' with respective divided underlying contact layers 2a, 2a' and 2b, 2b'. When a reverse bias is applied to at least one, for example, 1a' and 1b' of the divided electrodes, the reverse biased portion of the active layer 5 has exhibits a strongly saturable absorption property and a strong bistable property, thereby enabling one to provide a data storage function.

Figure 10:
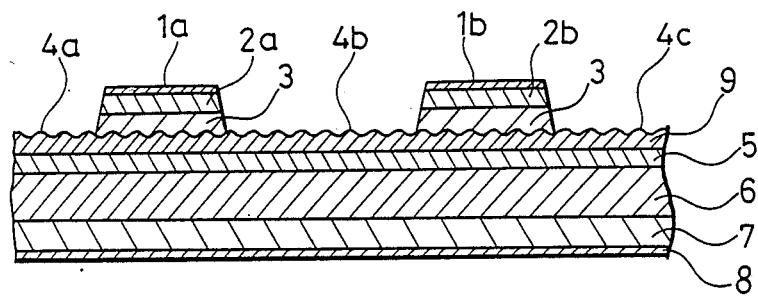
FIG. 10 shows a laser element of the distributed feedback type including a grating.
Figure 11:
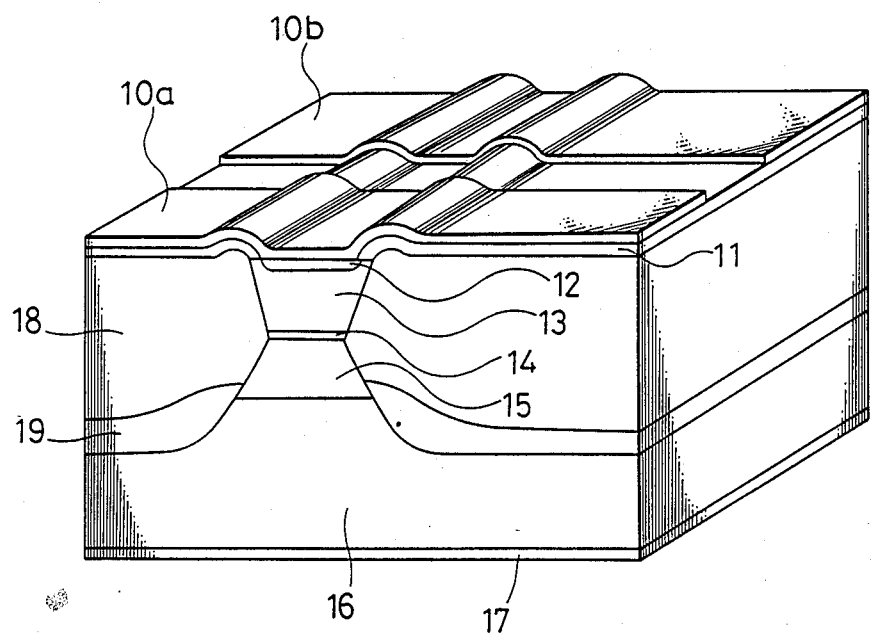
FIG. 11 shows another conventional light logic element.
Figure 12:
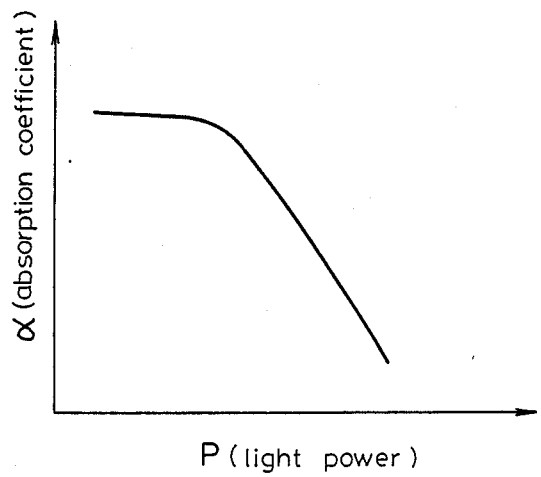
FIG. 12 illustrates the relationship between light power and the absorption coefficient produced by the light logic element of FIG. 11.
Figure 13:
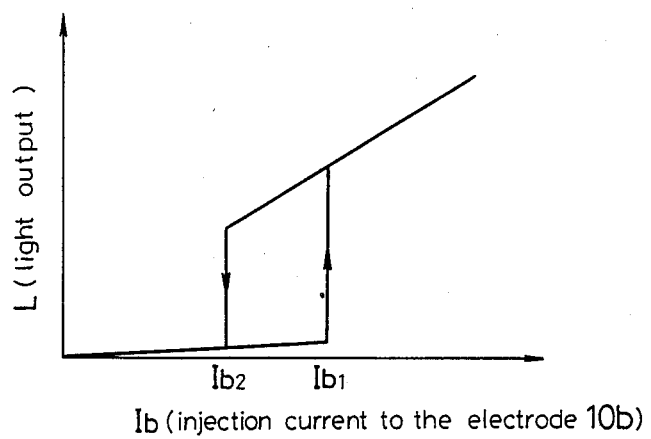
FIG. 13 illustrates the relationship between injection current to the electrode and light output produced by the light logic element of FIG. 11.

In the above-described second embodiment, a DBR laser is used as a laser element, but the laser element may be a distributed feedback type in which a grating exists below, as well as adjacent to the electrode portion, as shown in FIG. 10. In FIG. 10, the reference numeral 9 designates a light waveguide that has a refractive index different from that of the p-type cladding layer 3.

Figure 14:
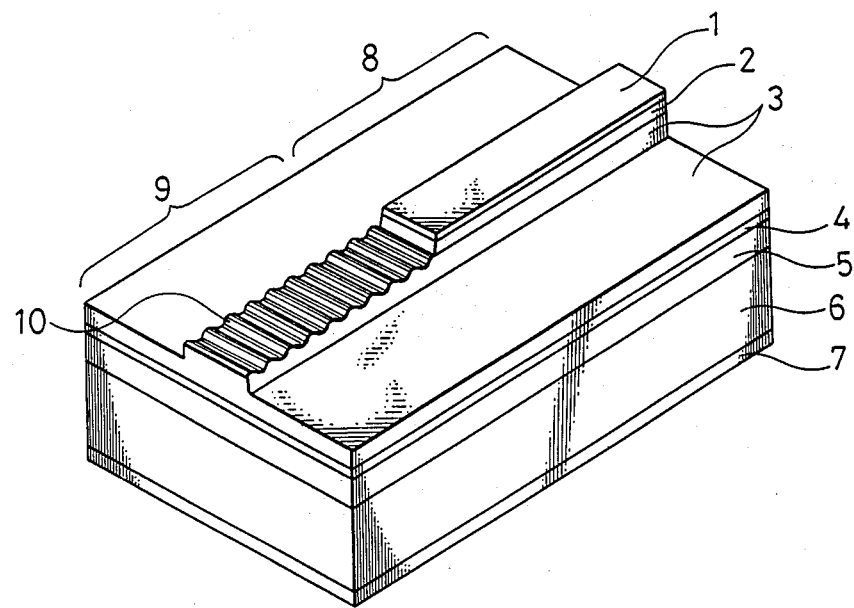
FIG. 14 shows a light-responsive semiconductor device according to a third embodiment of the present invention.

FIG. 14 shows a light-responsive semiconductor device constituting a bistable semiconductor laser as a third embodiment of the present invention. This laser is also of the distributed Bragg reflector type. Reference numeral 1 designates a p-side electrode, the reference numeral 2 designates a p-type GaAs contact layer, and reference numeral 3 designates a p-type AlGaAs light confinement layer. Reference numeral 4 designates a multi-quantum well active layer, reference numeral 5 designates an n-type AlGaAs light confinement layer, reference numeral 6 designates an n-type GaAs substrate, and reference numeral 7 designates an n-type electrode. The reference numeral 8 designates a gain region, reference numeral 9 designates an absorption region, and reference numeral 10 designates a grating.

The device is operated as follows.

Figure 15:
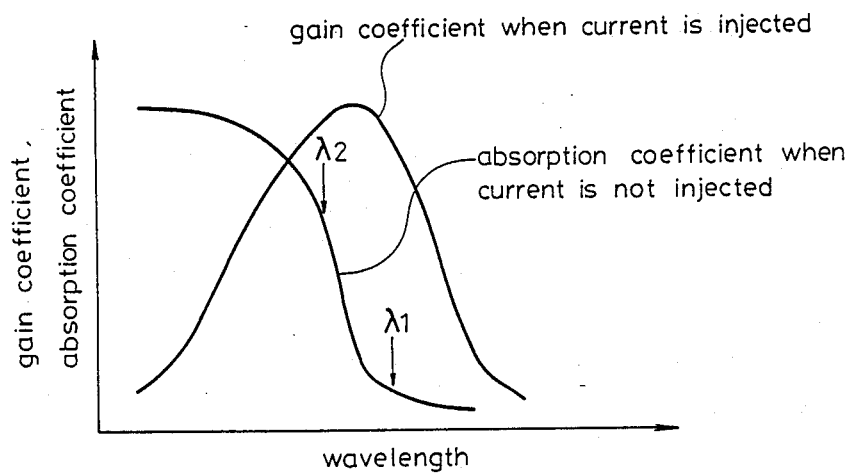
FIG. 15 illustrates the relationship between wavelength and (i) gain coefficient during current injection and (ii) the absorption coefficient in the absence of current injection in the device of FIG. 14.

FIG. 15 shows the wavelength dependency of the gain coefficient in the current injecting state and of the absorption coefficient in the current non-injecting state of the quantum well structure. As already described with respect to the prior art device, the absorption coefficient is low at the gain peak wavelength $\lambda_1$. Now, if the oscillation wavelength is shifted to a shorter wavelength $\lambda_2$ by the grating 10, the absorption coefficient becomes large, and it is possible to obtain a bistable property. Since a quantum well structure is used for the active layer in this embodiment, the operation speed is quite high and a rising time of 12 picoseconds is actually obtained by experiment. Furthermore, the grating makes the longitudinal mode oscillation a single wavelength, and the oscillation wavelength also becomes stable. In this embodiment, a ridge waveguide light confinement structure is used in the transverse direction, and there is no carrier confinement structure. Accordingly, the charge carriers generated in the absorption region by light absorption rapidly diffuse in the transverse direction, and quite a short fall time is obtained. Actually, the fall time obtained by experiment is below 100 picoseconds, and it is about half of that of the prior art bistable semiconductor laser.

In the third embodiment of the present invention, a quantum well structure is used for the active layer, and the oscillation wavelength is established by the grating at a shorter wavelength than the gain peak wavelength, whereby an enhancement of the operation speed and stabilization of the oscillation wavelength are realized.

In the above illustrated third embodiment, a laser of the DBR-type in which a grating is provided only at the absorption region is described. An alternative shown in FIG. 16 can be obtained by providing a grating along the entirety of the resonator as a distributed feedback laser and injecting a current into only a portion of the resonator.

Figure 17:
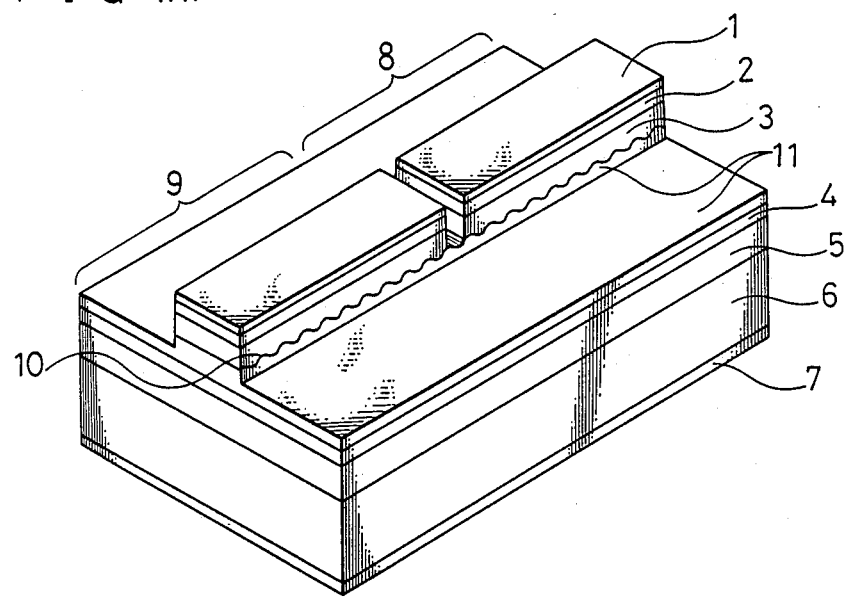
FIG. 17 shows an alternative of the third embodiment in which the electrode is divided into a plurality of sections.

FIG. 17 shows another alternative of the third embodiment. In this device, the electrode of the DFB-type laser is divided into a two (or more) parts. A large current is made flow through the gain region 8 and a slight current is made flow through the absorption region 9. Thus, the same effects as described above are obtained.

Figure 16:
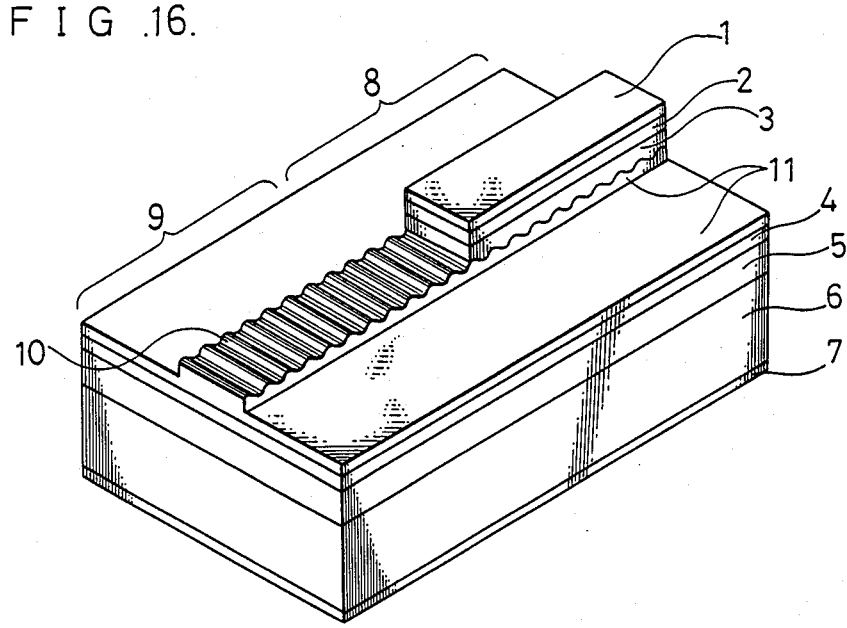
FIG. 16 shows a light-responsive semiconductor device similar to that of FIG. 14 in which a grating is provided along the entirety of the resonator.

Furthermore, in the lasers shown in FIGS. 14 and 16, there is no electrode at the absorption region, and therefore, it is possible for switching to occur by shining trigger light vertical to the substrate or this absorption region having no electrode.

What is claimed is:

1. A light-responsive semiconductor device in which a laser oscillation state is controlled by incident light, said device comprising a semiconductor laser structure including, serially disposed, a first electrode, a first conductivity type semiconductor substrate, a first conductivity type semiconductor first cladding layer, an active semiconductor layer, a second conductivity type semiconductor second cladding layer, a layer of material having a conductivity modulatable by light, and a second electrode transparent to light that modulates said layer, said layer responding to incident light to control the oscillation state of said laser.

2. The light-responsive semiconductor device of claim 1 wherein said material having a conductivity modulatable by light is CdS.

3. A light-responsive semiconductor device comprising:
   a first conductivity-type substrate;
   a first conductivity-type cladding layer, an active layer, and a second conductivity-type cladding layer successively disposed on said substrate;
   embedding layers disposed on said substrate at both sides of said active layer and said cladding layers, respectively;
   a second conductivity-type cap layer disposed on said second conductivity-type cladding layers and said embedding layers;
   a layer of a material having a conductivity modulatable by light disposed on said second conductivity-type cap layer; and
   a positive and a negative electrode disposed on said substrate and said conductivity modulatable material layer, respectively.

4. A semiconductor logic element comprising at least two spaced apart semiconductors lasers, said lasers each including serially disposed on a common substrate, a first cladding region, an active region, and a second cladding region, said lasers having a common first electrode disposed on said common substrate and having common layers disposed on said substrate from which the first cladding region and the active region of each laser are formed, each laser having a second electrode disposed in electrical contact with the second cladding region of the respective laser, including a diffraction grating extending at least between the lasers, said common layers forming a light waveguide between adjacent lasers for conducting light therebetween whereby the state of oscillation of one of said lasers biased at a current flow below its threshold laser current may be controlled by the state of oscillation of at least one adjacent laser.

5. The logic element of claim 4, wherein said diffraction grating is a second-order diffraction grating for directing light into and out of the element transverse to said substrate.

6. The logic element of claim 4 wherein said active regions are formed in a common layer having a multiple quantum well structure.

7. The logic element of claim 4 wherein said active regions are formed in a common layer, such as GaAs, having a strong saturable light absorption property when current is not being injected into said active region.

8. The logic element of claim 4 wherein at least one of said semiconductor lasers is a bistable logic element having two stable states in each of which different currents flow through adjacent ones of said second electrodes and having two stable states in which bias voltages of opposite polarities are respectively applied to said second electrodes.

9. A bistable semiconductor laser device comprising:
a substrate having a first electrode disposed thereon;
two different conductivity-type light confinement layers, a first of said confinement layers being disposed on said substrate;
a multiple quantum well active layer disposed between said two light confinement layers and having a peak gain wavelength;
an absorption region including a diffraction grating disposed on a portion of said first of said confinement layers, said absorption region lying between said grating and said substrate, for establishing an oscillation wavelength shorter than the peak gain wavelengthh in response to external light incident on said grating, the incident light switching the state of said light-responsive bistable semiconductor device; and
a current injection region disposed on a portion of said first of said confinement layers and said substrate including current injection means for injecting current into said multiple quantum well active layer other than at said absorption region, said current injection region including a second electrode.

10. The bistable semiconductor laser device of claim 9 wherein said current injection region lacks a diffraction grating on said first of said confinement layers.

11. The bistable semiconductor laser device of claim 9 wherein said current injection region includes a diffraction grating on said first of said confinement layers.

12. The bistable semiconductor laser of claim 10 which switches from a first state to a second state in response to incident light normal to said substrate.

13. The bistable semiconductor laser of claim 11 which switches from a first state to a second state in response to incident light normal to said substrate.

14. The bistable semiconductor laser device of claim 9 wherein said absorption and current injection regions are adjacent each other and said diffraction grating extends through both of said regions.

15. The bistable semiconductor laser device of claim 9 wherein said absorption and current injection regions comprise a ridge waveguide structure for confining light and current in the device.

16. The bistable semiconductor device of claim 14 wherein said absorption and current injection regions are spaced apart on said grating and each of said regions includes a portion of said second electrode.

17. A method of switching a bistable semiconductor laser device including at least two spaced apart semiconductor lasers, said lasers each including, serially disposed on a common substrate, a first cladding region, an active region, and a second cladding region, said lasers having a common first electrode disposed on said common substrate and having common layers disposed on said common substrate from which the first cladding region and the active region of each laser are formed, each laser having a second electrode disposed in electrical contact with the second cladding region of the respective laser, including a diffraction grating extending at least between the lasers, said common layers forming a light waveguide between adjacent lasers for conducting light therebetween, comprising:
biasing a first of said lasers with a current flow less than the threshold laser current of the said first laser; and
alternatively passing a current greater than and less than the threshold laser current of a second laser adjacent said first laser through said second laser to cause (i) oscillation and light emission and (ii) termination of oscillation and light emission of said second laser, respectively, thereby to cause (iii) oscillation and light emission and (iv) termination of oscillation and light emission of said first laser, respectively, in response.

18. A method of switching a bistable semiconductor laser device including at least three spaced apart semiconductor lasers, said lasers each including, serially disposed on a common substrate, a first cladding region, an active region, and a second cladding region, said lasers having a common first electrode disposed on said substrate and having common layers disposed on said common substrate from which the first cladding region and the active region of each laser are formed, each laser having a second electrode disposed in electrical contact with the second cladding region of the respective laser, including a diffraction grating extending at least between the lasers, said common layers forming a light waveguide between adjacent lasers for conducting light therebetweenn, comprising:
biasing a second of said lasers disposed between a first and third of said lasers with a current flow less than the laser threshold current of the said second laser; and
alternatively passing current greater than the respective laser threshold currents of said first and third lasers through said first and third lasers to cause (i) oscillation and light emission and (ii) termination of oscillation and light emission of said first and third lasers, respectively, thereby to cause (iii) oscillation and light emission and (iv) termination of oscillation and light emission of said second laser, respectively, in response.

19. A method of switching a bistable semiconductor laser device including at least three spaced apart semiconductor lasers, said lasers each including, serially disposed on a common substrate, a first cladding region, an active region, and a second cladding region, said lasers having a common first electrode disposed on said common substrate and having common layers disposed on said common substrate from which the first cladding region and the active region of each laser are formed, each laser having a second electrode disposed in electrical contact with the second cladding region of the respective laser, including a diffraction grating extending at least between the lasers, said common layers forming a light waveguide between adjacent lasers for conducting light therebetween, comprising:
biasing a second of said lasers disposed between a first and third of said lasers with a current flow less than the laser threshold current of the said second laser; and
alternatively passing currents greater than the respective laser threshold currents of at least one of said first and third lasers through said first and third lasers to cause (i) oscillation and light emission and (ii) termination of oscillation and light emission of one of said first and third lasers, respectively, thereby to cause (iii) oscillation and light emission and (iv) termination of oscillation and light emission of said second laser, respectively, in response.

* * * * *

UNITED STATES PATENT AND TRADEMARK OFFICE
CERTIFICATE OF CORRECTION

PATENT NO. : 4,888,783

DATED : December 19, 1989

INVENTOR(S) : Kojima et al.

It is certified that error appears in the above-identified patent and that said Letters Patent is hereby corrected as shown below:

On the title page:
In Item [75] Inventors, change "Hammanaka" to --Hamanaka--.

Signed and Sealed this

Tenth Day of December, 1991

Attest:

HARRY F. MANBECK, JR.

*Attesting Officer*   *Commissioner of Patents and Trademarks*